United States Patent
Ko et al.

(10) Patent No.: US 8,110,847 B2
(45) Date of Patent: Feb. 7, 2012

(54) NITRIDE-BASED SEMICONDUCTOR LIGHT EMITTING DIODE

(75) Inventors: Kun Yoo Ko, Hwaseong (KR); Je Won Kim, Seoul (KR); Dong Woo Kim, Seoul (KR); Hyung Jin Park, Yongin (KR); Seok Min Hwang, Busan (KR); Seung Wan Chae, Yongin (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 438 days.

(21) Appl. No.: 12/003,276

(22) Filed: Dec. 21, 2007

(65) Prior Publication Data

US 2008/0210972 A1 Sep. 4, 2008

(30) Foreign Application Priority Data

Jan. 3, 2007 (KR) .................. 10-2007-0000805

(51) Int. Cl.
*H01L 33/00* (2010.01)

(52) U.S. Cl. .................. 257/99; 257/E33.065

(58) Field of Classification Search ............ 257/99
See application file for complete search history.

(56) References Cited

U.S. PATENT DOCUMENTS

| | | | |
|---|---|---|---|
| 6,307,218 B1 | 10/2001 | Steigerwald et al. | |
| 6,633,120 B2 * | 10/2003 | Salam | 313/499 |
| 6,885,036 B2 | 4/2005 | Tarsa et al. | |
| 7,064,356 B2 * | 6/2006 | Stefanov et al. | 257/99 |
| 7,193,245 B2 * | 3/2007 | Zhao et al. | 257/91 |
| 2002/0063521 A1 | 5/2002 | Salam | |

FOREIGN PATENT DOCUMENTS

| | | |
|---|---|---|
| JP | 11-224960 | 8/1999 |
| JP | 2003-524295 A | 8/2003 |
| JP | 2005-019646 A | 1/2005 |
| JP | 2006-156590 | 6/2006 |
| WO | WO 01/41223 A1 | 6/2001 |

OTHER PUBLICATIONS

Japanese Office Action, with English Translation, issued in Japanese Patent Application No. 2007-331994, dated Jan. 18, 2011.
Japanese Office Action, w/ English translation thereof, issued in Japanese Patent Application No. 2007-331994, dated Aug. 2, 2011.

* cited by examiner

*Primary Examiner* — Jerome Jackson, Jr.
(74) *Attorney, Agent, or Firm* — McDermott Will & Emery LLP

(57) ABSTRACT

Provided is a nitride-based semiconductor LED including a substrate; a first conductive-type nitride semiconductor layer formed on the substrate; an active layer formed on a predetermined region of the first conductive-type nitride semiconductor layer; a second conductive-type nitride semiconductor layer formed on the active layer; a transparent electrode formed on the second conductive-type nitride semiconductor layer; a second conductive-type electrode pad formed on the transparent electrode; a plurality of second conductive-type electrodes extending from the second conductive-type electrode pad in one direction so as to be formed in a line; a first conductive-type electrode pad formed on the first conductive-type nitride semiconductor layer, where the active layer is not formed, so as to be positioned on the same side as the second conductive-type electrode pad; and a plurality of first conductive-type electrodes extending from the first conductive-type electrode pad in one direction so as to be formed in a line.

5 Claims, 3 Drawing Sheets

[FIG. 1] PRIOR ART
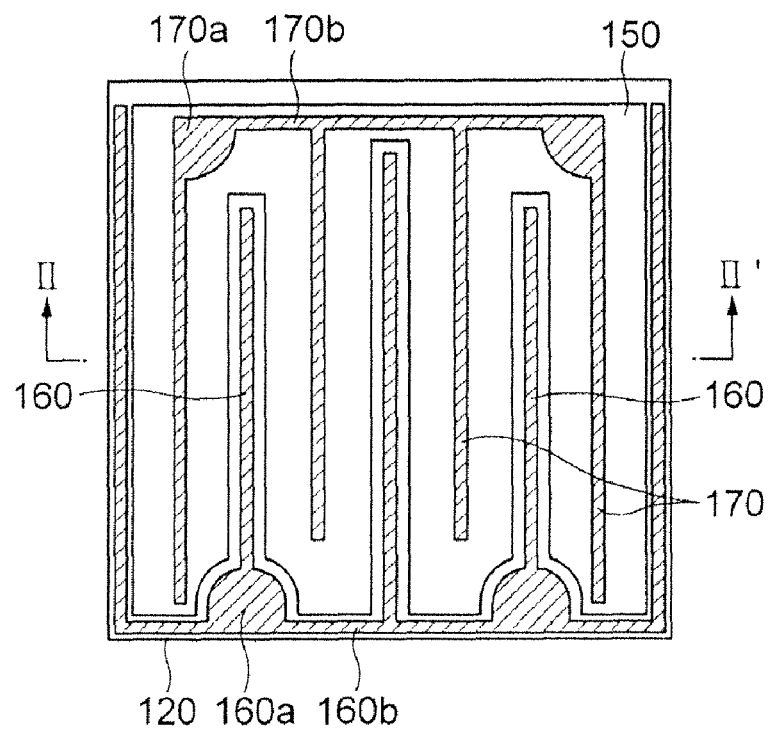
[FIG. 2] PRIOR ART
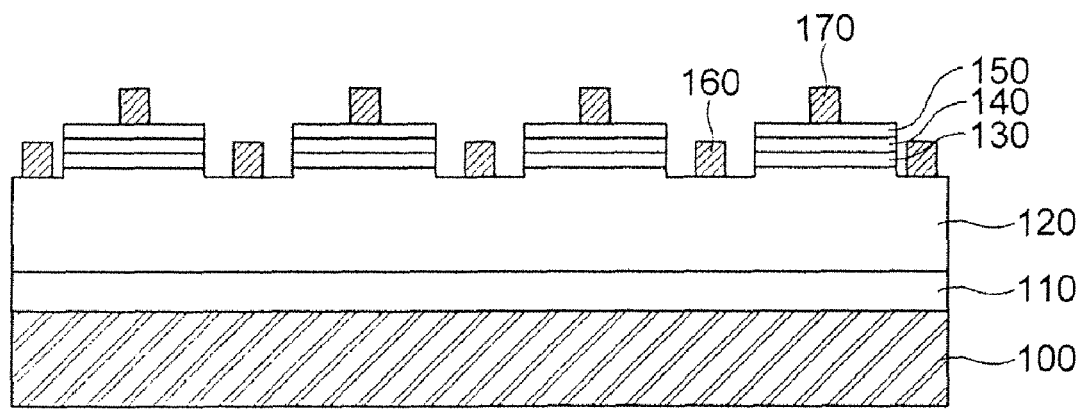

[FIG. 3]
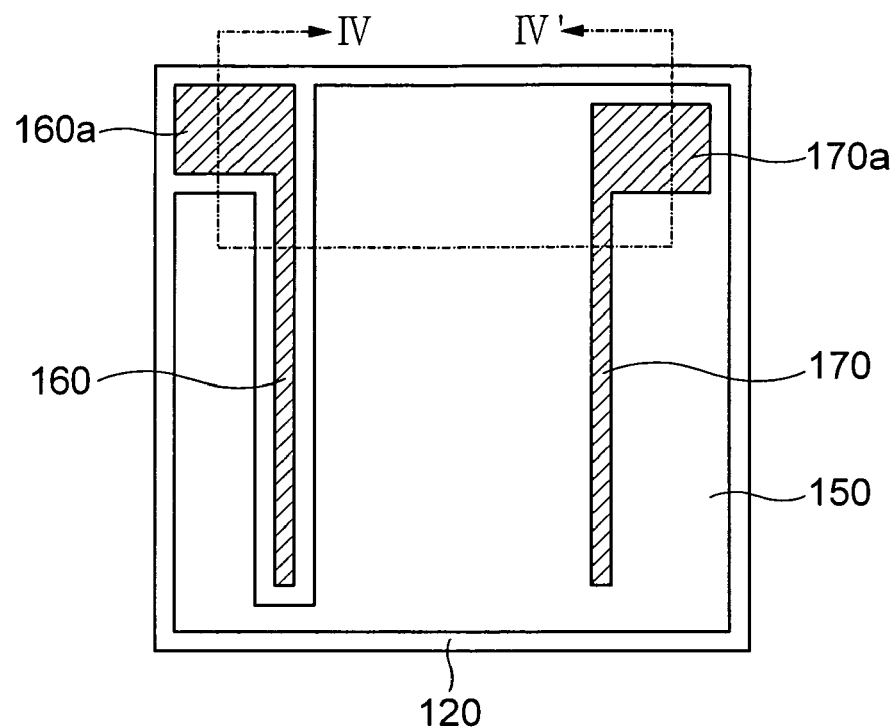
[FIG. 4]
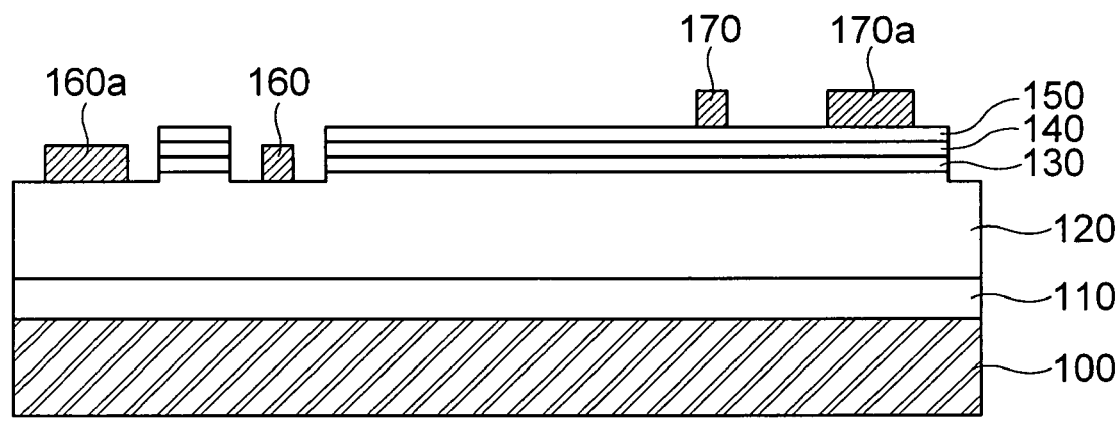

[FIG. 5]
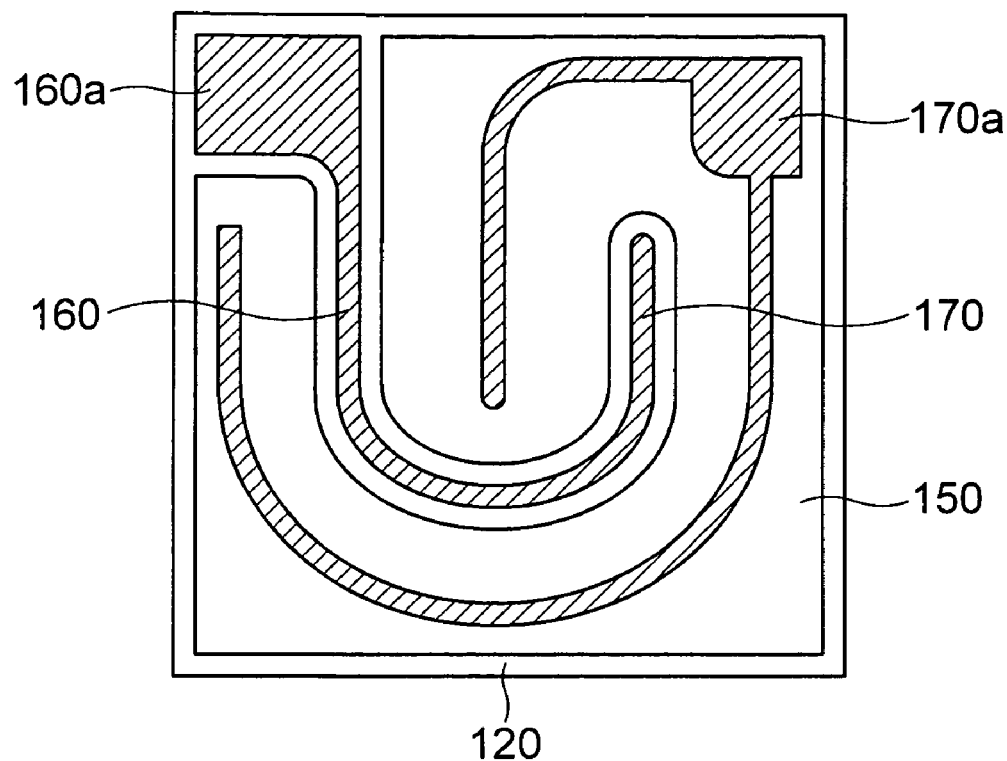
[FIG. 6]
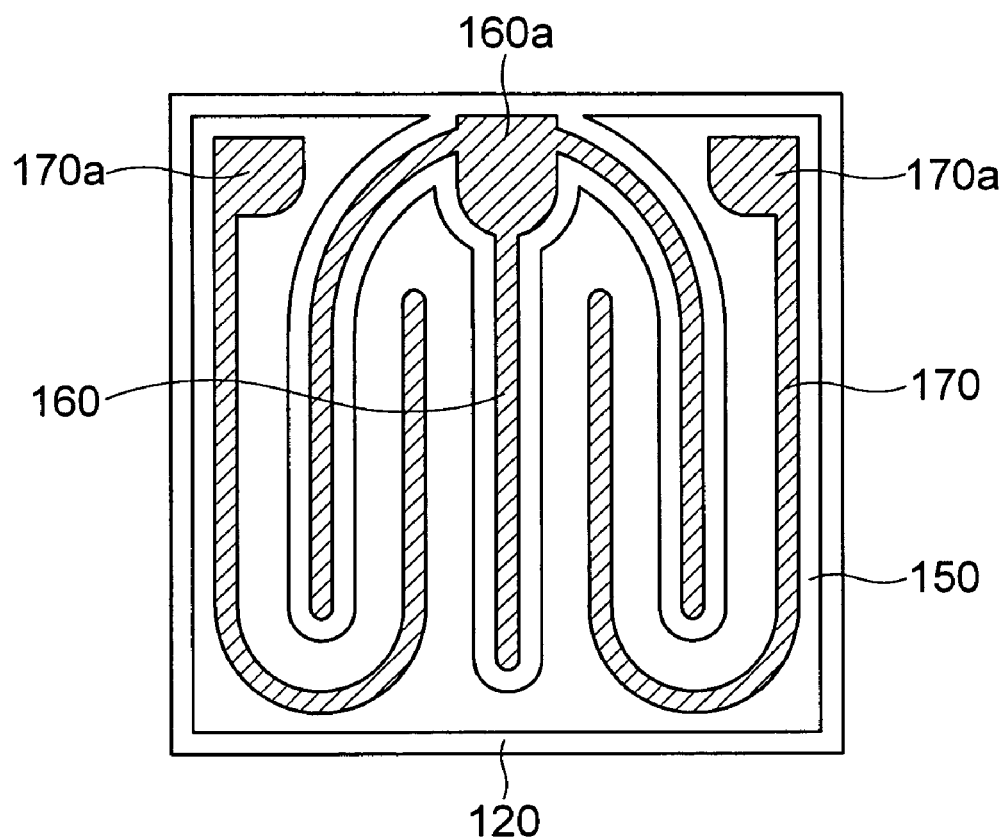

NITRIDE-BASED SEMICONDUCTOR LIGHT EMITTING DIODE

CROSS-REFERENCE TO RELATED APPLICATIONS

This application claims the benefit of Korean Patent Application No. 10-2007-0000805 filed with the Korea Intellectual Property Office on Jan. 3, 2007, the disclosure of which is incorporated herein by reference.

BACKGROUND OF THE INVENTION

1. Field of the Invention

The present invention relates to a nitride-based semiconductor light emitting diode (LED) which enhances current spreading efficiency by improving the structure of electrodes and electrode pads, thereby implementing a low driving voltage.

2. Description of the Related Art

In general, a nitride-based semiconductor is Group III-V semiconductor crystal having a compositional formula of $Al_x In_y Ga_{(1-x-y)}N$ (herein, $0 \leq x \leq 1$, $0 \leq y \leq 1$, and $0 \leq x+y \leq 1$) and is widely used for LEDs which can emit short-wavelength light (ultraviolet or green light), or particularly blue light.

Meanwhile, the nitride-based semiconductor LED is manufactured using an insulating substrate such as a sapphire substrate or SiC substrate which satisfies a lattice matching condition for crystal growth. Therefore, the nitride-based semiconductor LED has a planar structure that two electrodes connected to first and second conductive-type nitride semiconductor layers are arranged horizontally with the top surface of a light emission structure.

Recently, there is a demand for high luminance, in order to use the nitride-based semiconductor LED having a planar structure as a lighting source. To implement high luminance, a nitride-based semiconductor LED is being manufactured, in which a current can be uniformly spread to enhance light emission efficiency.

However, in the nitride-based semiconductor LED having a planar structure, a current flow is not uniformly distributed in the entire light emitting region, compared with a nitride-based semiconductor LED having a vertical structure that two electrodes are disposed on the top and bottom surfaces of a light emission structure, respectively. Therefore, an effective area used for light emission is not large, so that light emission efficiency is degraded.

Now, the problems of the conventional nitride-based semiconductor LED having a planar structure will be described in detail with reference to FIGS. 1 and 2.

FIG. 1 is a plan view of the conventional nitride-based semiconductor LED. FIG. 2 is a cross-sectional view taken along line II-II' of FIG. 1.

As shown in FIGS. 1 and 2, the conventional nitride-based semiconductor LED having a planar structure includes a buffer layer 110, a first conductive-type nitride semiconductor layer 120, a GaN/InGaN active layer 130 with a multi-quantum well structure, and a second conductive-type nitride semiconductor layer 140, which are sequentially formed on a sapphire substrate 100. The second conductive-type nitride semiconductor layer 140 and the active layer 130 are partially removed by mesa etching such that the top surface of the first conductive-type semiconductor layer 120 is partially exposed.

On the exposed first conductive-type nitride semiconductor layer 120, a plurality of first conductive-type electrode pads 160a, a plurality of first conductive-type electrodes 160, and a first conductive-type connection electrode 160b are formed. The first conductive-type connection electrode 160b extends from the first conductive-type electrode pads 160a so as to connect the first conductive-type electrodes 160.

On the second conductive-type nitride semiconductor layer 140, a transparent electrode 150 composed of ITO (Indium Tin Oxide) is formed. On the transparent electrode 150, a plurality of second conductive-type electrode pads 170a and a second conductive-type connection electrode 170b for connecting the second conductive-type electrode pads 170a are formed.

On the transparent electrode 150, a plurality of second conductive-type electrodes 170 are formed to extend from the plurality of second conductive-type electrode pads 170a and the second conductive-type connection electrode 170b in one direction. The conventional nitride-based semiconductor LED has a finger structure that the second conductive-type electrodes 170 are engaged with the first conductive-type electrodes 160, respectively. Therefore, in the conventional nitride-based semiconductor LED, the second conductive-type electrodes 170 and the first conductive-type electrodes 160 are spaced at a uniform distance from each other on the entire surface of the LED such that a current flow can be uniformly spread in the entire light emitting region of the LED.

In the conventional nitride-based semiconductor LED, the first and second conductive-type electrode pads 160a and 170a are connected to the respective electrodes through the first and second conductive-type connection electrodes 160b and 170b.

However, when the first and second conductive-type electrode pads 160a and 170a or the first and second conductive-type electrodes 160 and 170 are connected to each other through the first and second conductive-type connection electrodes 160b and 170b, respectively, an effective area used for light emission is reduced as much as the regions where the first and second conductive-type connection electrodes 160b and 170b are formed, with respect to the entire light emitting area.

Further, the first conductive-type electrode pads 160a and the second conductive-type electrode pads 170a are respectively formed on different sides, that is, on sides facing each other.

However, when the first conductive-type electrode pads 160a and the second conductive-type electrode pads are respectively formed on different sides facing each other, an effective area used for light emission is partially reduced as much as the regions where the first and second conductive-type electrode pads 160a and 170a are formed, with respect to the entire light emitting area. Then, the overall light emission efficiency decreases.

SUMMARY OF THE INVENTION

An advantage of the present invention is that it provides a nitride-based semiconductor LED in which the connection electrodes for connecting the first and second conductive-type electrode pads or the first and second electrodes are omitted, and the first and second conductive-type electrode pads are positioned on the same side such that an effective area used for light emission can be increased and the overall light emission efficiency can be increased by the first and second conductive-type electrode pads formed on the same side.

Additional aspects and advantages of the present general inventive concept will be set forth in part in the description which follows and, in part, will be obvious from the description, or may be learned by practice of the general inventive concept.

According to an aspect of the invention, a nitride-based semiconductor LED comprises a substrate; a first conductive-type nitride semiconductor layer formed on the substrate; an active layer formed on a predetermined region of the first conductive-type nitride semiconductor layer; a second conductive-type nitride semiconductor layer formed on the active layer; a transparent electrode formed on the second conductive-type nitride semiconductor layer; a second conductive-type electrode pad formed on the transparent electrode; a plurality of second conductive-type electrodes extending from the second conductive-type electrode pad in one direction so as to be formed in a line; a first conductive-type electrode pad formed on the first conductive-type nitride semiconductor layer, where the active layer is not formed, so as to be positioned on the same side as the second conductive-type electrode pad; and a plurality of first conductive-type electrodes extending from the first conductive-type electrode pad in one direction so as to be formed in a line.

According to another aspect of the invention, a nitride-based semiconductor LED comprises a substrate; a first conductive-type nitride semiconductor layer formed on the substrate; an active layer formed on a predetermined region of the first conductive-type nitride semiconductor layer; a second conductive-type nitride semiconductor layer formed on the active layer; a transparent electrode formed on the second conductive-type nitride semiconductor layer; more than two second conductive-type electrode pads formed separately from each other on the transparent electrode so as to be positioned on the same side; a plurality of second conductive-type electrodes extending from the second conductive-type electrode pad in one direction so as to be formed in a line; one or more first conductive-type electrode pads formed on the first conductive-type nitride semiconductor layer, where the active layer is not formed, so as to be positioned on the same side as the second conductive-type electrode pad; and a plurality of first conductive-type electrodes extending from the first conductive-type electrode pad in one direction so as to be formed in a line.

According to a further aspect of the invention, a nitride-based semiconductor LED comprises a substrate; a first conductive-type nitride semiconductor layer formed on the substrate; an active layer formed on a predetermined region of the first conductive-type nitride semiconductor layer; a second conductive-type nitride semiconductor layer formed on the active layer; a transparent electrode formed on the second conductive-type nitride semiconductor layer; one or more second conductive-type electrode pads formed on the transparent electrode so as to be positioned on the same side; a plurality of second conductive-type electrode pads extending from the second conductive-type electrode pads in one direction so as to be formed in a line; more than two first conductive-type electrode pads formed separately from each other on the first conductive-type nitride semiconductor layer, where the active layer is not formed, so as to be positioned on the same side as the second conductive-type electrode pad; and a plurality of first conductive-type electrodes extending from the first conductive-type electrode pad in one direction so as to be formed in a line.

Preferably, portions of the first and second conductive-type electrodes, which join the respective electrode pads, are formed in a straight line or curved line.

Preferably, the first and second conductive-type electrodes are formed to extend from the first and second conductive-type electrode pads, respectively, so as to be curved toward the first and second conductive-type electrode pads at the side facing the first and second conductive-type electrode pads.

Preferably, the first and second conductive-type nitride semiconductor layers are n-type and p-type nitride semiconductor layers, respectively.

Preferably, the active layer is formed on the first conductive-type nitride semiconductor layer such that the outermost side of the active layer is positioned inwardly at a predetermined distance from the outermost side of the first conductive-type nitride semiconductor layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view of a conventional nitride-based semiconductor LED;

FIG. 2 is a cross-sectional view taken along line II-II' of FIG. 1;

FIG. 3 is a plan view of a nitride-based semiconductor LED according to an embodiment of the invention;

FIG. 4 is a cross-sectional view taken along line IV-IV' of FIG. 3;

FIG. 5 is a plan view of a nitride-based semiconductor LED according to a first modification of the invention; and FIG. 6 is a plan view of a nitride-based semiconductor LED according to a second modification of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a nitride-based semiconductor LED according to an embodiment of the present invention will be described in detail with reference to the accompanying drawings.

First, the structure of the nitride-based semiconductor LED according to an embodiment of the invention will be described in detail with reference to FIGS. 3 and 4.

FIG. 3 is a plan view of the nitride-based semiconductor LED according to an embodiment of the invention, and FIG. 4 is a cross-sectional view taken along line IV-IV' of FIG. 3.

Referring to FIGS. 3 and 4, the nitride-based semiconductor according to an embodiment of the invention includes a buffer layer 110, a first conductive-type nitride semiconductor layer 120, an active layer 130, and a second conductive-type nitride semiconductor layer 140, which are sequentially laminated on an optically-transparent substrate 100, thereby forming a light emission structure.

Preferably, the substrate 100 which is suitable for growing nitride semiconductor single crystal is formed of a transparent material including sapphire. In addition to sapphire, the substrate 100 may be formed of zinc oxide (ZnO), gallium nitride (GaN), silicon carbide (SiC), or aluminum nitride (AlN).

The buffer layer 110 is provided to enhance lattice matching with the substrate 100 formed of a transparent material including sapphire, before the first conductive-type nitride semiconductor layer 120 is grown on the substrate 100. In general, the buffer layer 110 is formed of nitride containing GaN or Ga, for example, SiC/InGaN. The buffer layer 110 may be omitted depending on device characteristics and process conditions.

The first conductive-type nitride semiconductor layer 120, the active layer 130, and the second conductive nitride semiconductor layer 140 may be formed of a semiconductor material having a compositional formula of $In_xAl_yGa_{(1-x-y)}N$ (here, $0 \leqq x$, $0 \leqq y$, and $x+y \leqq 1$).

More specifically, the first and second conductive-type nitride semiconductor layers 120 and 140 may be formed of a GaN or GaN/AlGaN layer doped with n-type conductive impurities or a GaN or GaN/AlGaN layer doped with p-type conductive impurities. As for the n-type conductive impurities, Si, Ge, Sn and so on are used. As for the p-type conductive impurities, Mg, Zn, Be and so on are used. In this embodiment, the first conductive type is the n-type, and the second conductive type is the p-type.

The active layer 130 may be formed of an InGaN/GaN layer with a multi-quantum well structure.

Alternately, the active layer 130 may be formed of a single quantum well layer or with a double-hetero structure.

The active layer 130 and the second conductive-type nitride semiconductor layer 140 are partially removed by mesa etching such that the top surface of the first conductive-type nitride semiconductor layer 120 formed on the bottom surface is partially exposed. Preferably, the outermost side of the active layer 130 is formed inwardly at a predetermined distance from the outermost side of the first conductive-type nitride semiconductor layer 120. In such a structure, when the nitride-based semiconductor LED is driven, a current flow applied from a first conductive-type electrode pad is uniformly spread on the entire surface of the active layer 130, that is, the entire light emitting area.

On the exposed first conductive-type nitride semiconductor layer 120, a first conductive-type electrode pad 160a is formed. Preferably, the first conductive-type electrode pad 160a is formed on a region adjacent to the outermost side of the first conductive-type nitride semiconductor layer 120, in order to minimize a loss of the light emitting area.

Further, on the exposed first conductive-type nitride semiconductor layer 120, a plurality of first conductive-type electrodes 160 are formed to extend from the first conductive-type electrode pad 160a so as to be arranged in a line parallel to one side of the first conductive-type nitride semiconductor layer 120.

In this embodiment, it is described that one first conductive-type electrode 160 is formed, referring to FIG. 3. Without being limited thereto, however, the number of first conductive-type electrodes can be changed depending on device characteristics and process conditions, or particularly the number of second conductive-type electrodes which will be described below.

On the second conductive-type nitride semiconductor layer 140, a transparent electrode 150 is formed. The transparent electrode 150 may be formed of a thin metal film with high conductivity and low contact resistance as well as conductive metal oxide such as ITO (Indium Tin Oxide), if the thin metal film has high transmittance with respect to the light emission wavelength of the LED.

On the transparent electrode 150, a second conductive-type electrode pad 170a and a plurality of second conductive-type electrodes 170 are formed. The second conductive-type electrodes 170 extend from the second conductive-type electrode pad 170a so as to be arranged in a line.

The second conductive-type electrode pad 170a is formed so as to be positioned on the same side as the first conductive-type electrode pad 160a.

In other words, as the second conductive-type electrode pad 170a is formed on the same side of the first conductive-type electrode pad 160a, it is possible to enhance light emission efficiency of the nitride-based semiconductor LED, while the first and second conductive-type electrode pads 160a and 170a of the conventional nitride-based semiconductor LED are separately formed on sides facing each other, respectively, such that the light emission efficiency thereof is degraded.

Further, the linear second conductive-type electrode 170 extending from the second conductive-type electrode pad 170a in one direction is formed in parallel to the linear first conductive-type electrode 160 extending from the first conductive-type electrode pad 160a in one direction such that a current smoothly flows. In this case, portions where the first and second conductive-type electrodes 160 and 170 formed in a line join the first and second conductive-type electrode pads 160a and 170a, respectively, may be formed in a straight line or curved line. This may be changed depending on the characteristics of the LED.

Meanwhile, the meaning of 'line' does not necessarily indicate a straight line, and may include a curved line which will be described.

First Modification

Hereinafter, the structure of a nitride-based semiconductor LED according to a first modification of the invention will be described with reference to FIG. 5. However, the descriptions of the same components of the nitride-based semiconductor LED as those of the nitride-based semiconductor LED according to the embodiment of the invention will be omitted.

FIG. 5 is a plan view of the nitride-based semiconductor LED according to the first modification of the invention. As shown in FIG. 5, the nitride-based semiconductor LED has a finger structure that the second conductive-type electrode 170 extending from the second conductive-type electrode pad 170a in one direction is engaged with the first conductive-type electrode 160.

More specifically, the first and second conductive-type electrodes 160 and 170 are formed to extend from the first and second conductive-type electrode pads 160a and 170a, respectively, so as to be curved toward the first and second conductive-type electrode pads 160a and 170a at the side facing the first and second conductive-type electrode pads 160a and 170a. In such a structure, light is uniformly emitted from the entire light emitting surface with a large area.

Accordingly, the first and second conductive-type electrodes 160 and 170 can be spaced at a uniform distance from each other on the entire surface of the LED such that a current flow is uniformly spread on the entire light emitting region of the LED.

Further, portions of the first and second conductive-type electrodes 160 and 170, which join the respective electrode pads 160a and 170a, and portions of the first and second conductive-type electrodes 160 and 170 at the side facing the respective electrode pads 160a and 170 are formed in a curved line.

In other words, the portions of the first and second conductive-type electrodes 160 and 170, which join the respective electrode pads 160a and 170a, and the portions of the first and second conductive-type electrodes 160 and 170 at the side facing the respective electrodes 160a and 170a form curved portions with a slow angle.

In the conventional LED, a current is crowded into the perpendicularly-curved portions where the first and second conductive-type 160 and 170 join the respective electrode pads 160a and 170a. However, the nitride-based semiconductor LED according to the first modification can solve the problem. Further, the light emitting surface can be further widened, thereby enhancing light emission efficiency.

Second Modification

Hereinafter, the structure of a nitride-based semiconductor LED according to a second modification of the invention will be described with reference to FIG. 6. However, the descriptions of the same components of the nitride-based semiconductor LED as those of the nitride-based semiconductor LED according to the first modification of the invention will be omitted.

FIG. 6 is a plan view of the nitride-based semiconductor LED according to the second modification of the invention. In this modification, one or more first conductive-type electrode pads 160a may be provided on the same side, depending on device characteristics, as shown in FIG. 6. When more than two first conductive-type electrode pads 160a are provided, they are formed separately from each other. In this modification, the nitride-based semiconductor LED is provided with one first conductive-type electrode pad 160a, as shown in FIG. 6.

Further, one or more second conductive-type electrode pads 170a may be provided on the same side, depending on device characteristics. When more than two second conductive-type electrode pads 170a are provided, they are formed separately from each other. In this modification, the nitride-based semiconductor LED is provided with two second conductive-type electrode pads 170a, as shown in FIG. 6.

The nitride-based semiconductor LED has a finger structure that first and second conductive-type electrodes 160 and 170 extending from the first and second conductive-type electrode pads 160a and 170a formed on the same side are engaged with each other.

As a demand for higher light emission efficiency than existing small-sized mobile chips increases, the application of high current and an increase in area are required. Therefore, in the nitride-based semiconductor LED according to this modification, the number of electrode pads and the number of electrodes extending from the electrode pads are increased, so that a current is easily spread on a large area.

Meanwhile, in the embodiment and the first and second modifications according to the invention, the shape of the first and second conductive-type electrode pads 160a and 170a is formed in a rectangle, a semi-circle, or a quarter-circle. Without being limited thereto, however, the first and second conductive-type electrode pads 160a and 170a may be formed in various shapes.

According to the present invention, the respective connection electrodes for connecting the plurality of first and second conductive-type electrode pads or the plurality of first and second conductive-type electrodes are omitted, so that an effective area used for light emission can be increased in the entire light emitting area.

Further, the first and second conductive-type electrode pads are not partially formed on the entire light emitting surface, but are formed on the same side so as to be separated from each other. Therefore, it is possible to enhance light emission efficiency.

Further, the portions of the first and second conductive-type electrodes, which join the respective electrode pads, and the portions of the first and second conductive-type electrodes at the side facing the first and second conductive-type electrode pads form curved portions with a slow angle such that the crowding of current into the curved portions can be minimized.

Therefore, the current crowding effect of the nitride-based semiconductor LED can be minimized, and the luminance characteristic thereof can be enhanced, which makes it possible to improve the characteristic and reliability of devices.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride-based semiconductor LED comprising:
    a substrate;
    a first conductivity type nitride semiconductor layer formed on the substrate;
    an active layer formed on a predetermined region of the first conductivity type nitride semiconductor layer;
    a second conductivity type nitride semiconductor layer formed on the active layer;
    a transparent electrode formed on the second conductivity type nitride semiconductor layer and having four sides the four sides including first and second sides opposed to each other;
    two second type electrode pads formed separately from each other on the transparent electrode so as to be positioned on the first side;
    two second type electrodes formed on the transparent electrode and each having a first linear portion extending from the second type electrode type pads toward the second side, a rounded portion curved toward first and second type electrode pads and a second linear portion extending toward the first side, wherein the first linear portion, the rounded portion and the second linear portion are sequentially connected;
    a first type electrode pads formed on the first conductivity type nitride semiconductor layer, where the active layer is not formed, so as to be positioned on the first side; and
    three first type electrodes extending from the first type electrode pad toward the second side,
    wherein one of the first type electrodes is disposed between the second linear portions of the two second type electrodes and each of the remaining two first type electrodes is disposed between the first and second linear portions of each of the two second type electrodes respectively.

2. The nitride-based semiconductor LED according to claim 1, wherein the first and second conductivity-type nitride semiconductor layers are n-type and p-type nitride semiconductor layers, respectively.

3. The nitride-based semiconductor LED according to claim 1, wherein portions of the first and second-type electrodes, which join the respective electrode pads, are formed in a straight line or curved line.

4. The nitride-based semiconductor LED according to claim 1, wherein the first and second conductivity-type nitride semiconductor layers are n-type and p-type nitride semiconductor layers, respectively.

5. The nitride-based semiconductor LED according to claim 1, wherein the active layer is formed on the first conductivity-type nitride semiconductor layer such that the outermost side of the active layer is positioned inwardly at a predetermined distance from the outermost side of the first conductivity type nitride semiconductor layer.

* * * * *